United States Patent
Okushima et al.

(10) Patent No.: US 8,361,336 B2
(45) Date of Patent: Jan. 29, 2013

(54) IMPRINT METHOD FOR IMPRINTING A PATTERN OF A MOLD ONTO A RESIN MATERIAL OF A SUBSTRATE AND RELATED SUBSTRATE PROCESSING METHOD

(75) Inventors: Shingo Okushima, Tokyo (JP); Junichi Seki, Yokohama (JP); Haruhito Ono, Minamiashigara (JP); Nao Nakatsuji, Kawasaki (JP); Atsunori Terasaki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 895 days.

(21) Appl. No.: 12/282,454

(22) PCT Filed: Aug. 1, 2008

(86) PCT No.: PCT/JP2008/064265
§ 371 (c)(1), (2), (4) Date: Sep. 10, 2008

(87) PCT Pub. No.: WO2009/020196
PCT Pub. Date: Feb. 12, 2009

(65) Prior Publication Data
US 2011/0042352 A1 Feb. 24, 2011

(30) Foreign Application Priority Data

Aug. 3, 2007 (JP) .................................. 2007-203044
Aug. 3, 2007 (JP) .................................. 2007-203050
Jul. 14, 2008 (JP) .................................. 2008-182297

(51) Int. Cl.
B44C 1/22 (2006.01)

(52) U.S. Cl. ................ 216/44; 216/41; 216/52; 216/67; 216/72; 425/174.4; 425/175; 425/176; 425/177; 425/193

(58) Field of Classification Search .................. 216/41, 216/44, 52, 67, 72; 425/174.4, 175–177, 425/193
See application file for complete search history.

(56) References Cited

U.S. PATENT DOCUMENTS

| 6,334,960 B1 | 1/2002 | Willson et al. .................. 216/52 |
| 7,396,475 B2 | 7/2008 | Sreenivasan |
| 7,435,074 B2 * | 10/2008 | Colburn et al. ............... 425/385 |
| 2004/0007799 A1 * | 1/2004 | Choi et al. .................... 264/494 |
| 2004/0211754 A1 | 10/2004 | Sreenivasan |

(Continued)

FOREIGN PATENT DOCUMENTS

| EP | 1 762 893 A1 | 3/2007 |
| JP | 2000-194142 | 7/2000 |
| JP | 2007-287951 | 11/2007 |

OTHER PUBLICATIONS

Communication pursuant to Article 94(3) EPC mailed in a communication dated Oct. 28, 2010, in counterpart European patent application No. 08 792 322.3-2222.

(Continued)

*Primary Examiner* — Lan Vinh
*Assistant Examiner* — Maki Angadi
(74) *Attorney, Agent, or Firm* — Fitzpatrick, Cella, Harper & Scinto

(57) ABSTRACT

An imprint method for imprinting a pattern of a mold onto a resin material on a substrate. The imprint method includes a step of forming a processed area in which an imprint pattern corresponding to the pattern of the mold is formed, and an outside area formed of a periphery of the processed area, by bringing the mold into contact with the resin material formed on the substrate, so that a portion of the resin material is extruded from the processed area into the outside area, a step of forming a protection layer for protecting the processed area, and a step of removing a layer of the resin material in the outside area, while the imprint pattern formed on a layer of the resin material in the processed area, is protected by the protection layer, so as not to be removed.

7 Claims, 15 Drawing Sheets

U.S. PATENT DOCUMENTS

| | | | | |
|---|---|---|---|---|
| 2006/0060557 | A1 | 3/2006 | Sreenivasan | 216/11 |
| 2006/0177532 | A1* | 8/2006 | Fletcher et al. | 425/174.4 |
| 2006/0272535 | A1 | 12/2006 | Seki et al. | 101/492 |
| 2006/0273488 | A1 | 12/2006 | Seki et al. | 264/293 |
| 2006/0279022 | A1 | 12/2006 | Seki et al. | 264/320 |
| 2007/0246441 | A1* | 10/2007 | Kim et al. | 216/41 |
| 2008/0042320 | A1 | 2/2008 | Seki et al. | 264/293 |

OTHER PUBLICATIONS

Stephen Y. Chou, et al., "Imprint of Sub-25 nm vias and trenches in Polymers," Applied Physics Letters, vol. 67, Issue 21, Nov. 20, 1995, pp. 3114-3116.

T. Bailey, et al., "Step and Flash Imprint Lithography: Template Surface Treatment and Defect Analysis," J. Vac. Sci. Technology B, vol. 18, No. 6, 2000, pp. 3572-3577.

Written Opinion of the International Searching Authority mailed Nov. 7, 2008, issued in corresponding International Application No. PCT/JP2008/064265.

International Search Report dated Oct. 30, 2008, which issued in corresponding International Application No. PCT/JP2008/064265.

Korean Notice of Allowance dated Apr. 30, 2012, issued in counterpart Korean patent application No. 10-2010-7003787.

* cited by examiner

IMPRINT METHOD FOR IMPRINTING A PATTERN OF A MOLD ONTO A RESIN MATERIAL OF A SUBSTRATE AND RELATED SUBSTRATE PROCESSING METHOD

This application is a U.S. national stage application of PCT International Application No. PCT/JP2008/064265, filed Aug. 1, 2008, which claims priority from Japanese patent application number 2007-203044, filed Aug. 3, 2007, Japanese patent application number 2007-203050, filed Aug. 3, 2007, and Japanese patent application publication number 2008-182297, filed Jul. 14, 2008.

TECHNICAL FIELD

The present invention relates to an imprint method for imprinting a pattern of a mold onto a resin material on a substrate and a method of processing the substrate using the imprint method.

BACKGROUND ART

In recent years, a processing technology for transferring a fine structure on a mold onto a member to be processed, such as a resin material, a metal material, or the like, has been developed and has received attention (Stephan Y. Chou, et al., Appl. Phys. Lett., Vol. 67, Issue 21, pages 3114-3116 (1995)). This technology is called nanoimprinting or nanoembossing, and provides a resolution on the order of several nanometers. For this reason, the technology has been increasingly expected to be applied to next-generation semiconductor manufacturing technologies in place of light exposure devices, such as a stepper, a scanner, and the like. Further, the technology is capable of collectively processing a three-dimensional structure at a wafer level, so that the technology has been expected to be applied to a wide variety of fields, such as manufacturing technologies for optical devices, such as photonic crystals and biochips, such as μ-Tas (Micro Total Analysis System).

In a case when such a processing technology is applied to the semiconductor manufacturing technology, the processing technology is performed in the following manner.

A work (workpiece), including a substrate (e.g., a semiconductor wafer) and a photocurable resin material layer disposed on the substrate, and a mold, on which a desired imprint (projection/recess) pattern, is formed, are disposed opposite to each other and between the work and the mold, and the resin material is filled, followed by irradiation of ultraviolet (UV) light to cure the resin material.

By this, the above pattern is transferred onto the resin material layer and then etching, or the like, is effected by using the resin material layer as a mask, so that pattern formation on the substrate is performed.

In a case when the (nano-) imprint method is used as lithography for the semiconductor manufacturing technology, a step-and-repeat method, in which a mold is prepared depending on a chip to be produced and a pattern on the mold is repeatedly transferred onto a substrate, is available. This is because it is possible to improve the accuracy by reducing an integral error of alignment and the mold pattern itself due to an increase in wafer size, and it is possible to reduce a production cost of the mold increased by the increase in the wafer size.

In the resin material layer transferred on the substrate, as an underlying portion of the pattern, a thick portion, which is generally called a residual film, is present. By removing the residual film, a mold layer for processing the substrate is completed. Herein, this mold layer is referred to as an "etching barrier".

As a conventional imprint method, Japanese Laid-Open Patent Application No. 2000-194142 proposes a method (process), in which an etching barrier is formed by a single layer of a UV-curable resin material, and the entire surface of the layer is etched. Such a process is referred to herein as a "single layer process"). Further, such a process that a thickness is uniformly reduced by etching the entire surface is referred to herein as an "etch back" process.

U.S. Patent Application Publication No. 2006/0060557 proposes a method (process) for forming a reverse pattern by using a resin material layer and a material capable of ensuring an etching selection ratio with the resin material layer. In this method, a reverse layer of the material capable of ensuring an etching selection ratio with the resin material layer is applied onto the resin material layer, and then, an etch back process is performed until a projection of the resin material layer is exposed. Finally, the resin material layer is etched by using the reverse layer embedded in a recess of the resin material layer as a mask. Herein, such a process is referred to as a "reverse process". In the reverse process, the resultant etching barrier has a more perpendicular processing shape, and the dimensional accuracy thereof is also enhanced.

In a case when a pattern is formed on a substrate by the above-described conventional imprint method, the following problem can arise.

That is, as shown in FIG. 8, when imprinting for one shot is performed, a resin material can be pressed out of a shot area to form an outside area (extrusion area) 1254 extending on a substrate 1253 along an edge of a mold 1251. The resin material layer in this outside area 1254 has a thickness more than that of the resin material layer in a processed area 1255, in many cases. For example, the thickness of the resin material layer or a height or a depth of projections or recesses of an imprint pattern in the processed area 1255 is several tens of nanometers to several hundreds of nanometers, whereas the thickness of the resin material layer in the outside area 1254 can be several micrometers.

In the case of using imprinting for semiconductor lithography, as described above, the step-and-repeat method is suitable. However, when the pattern transfer onto the substrate is repeatedly performed by the step-and-repeat method, the outside area 1254 is formed for each shot.

By the formation of such an outside area 1254, a problem can arise that an etching characteristic is different between that in the neighborhood of the outside area and that in an area apart from the outside area. For example, in the case when a projection structure on an order that is considerably larger than the imprinting pattern is present in the neighborhood, a distribution of an electrical field of plasma during etching can be disturbed, or flow of an etching gas can be prevented. Further, the etching includes a chemical reaction, so that in the neighborhood of the outside area where an exposed area of the resin material layer is very large, compared with the area apart from the outside area, consumption of an etching gas can be required locally in a large amount. As a result, such a phenomenon that the etching characteristic in the neighborhood of the outside area is different from that in the area apart from the outside area can occur.

DISCLOSURE OF THE INVENTION

In view of the problem described above, a principal object of the present invention is to provide an imprinting method capable of easily removing a layer of a resin material, in an outside area, extruded from a processed area.

Another object of the present invention is to provide a processing method of a substrate using the imprinting method.

According to the present invention, it is possible to realize an imprinting method capable of easily removing the layer of the resin material, in the outside area, extruded from the processed area. It is also possible to provide a processing method of the substrate using the imprinting method.

According to the present invention, it is possible to provide an imprinting method capable of easily removing the layer of the resin material, in the outside area, extruded from the processed area. It is also possible to provide a processing method of the substrate using the imprinting method.

These and other objects, features and advantages of the present invention will become more apparent upon a consideration of the following description of the preferred embodiments of the present invention, taken in conjunction with the accompanying drawings.

BEST MODE FOR CARRYING OUT THE INVENTION

Figure 1:
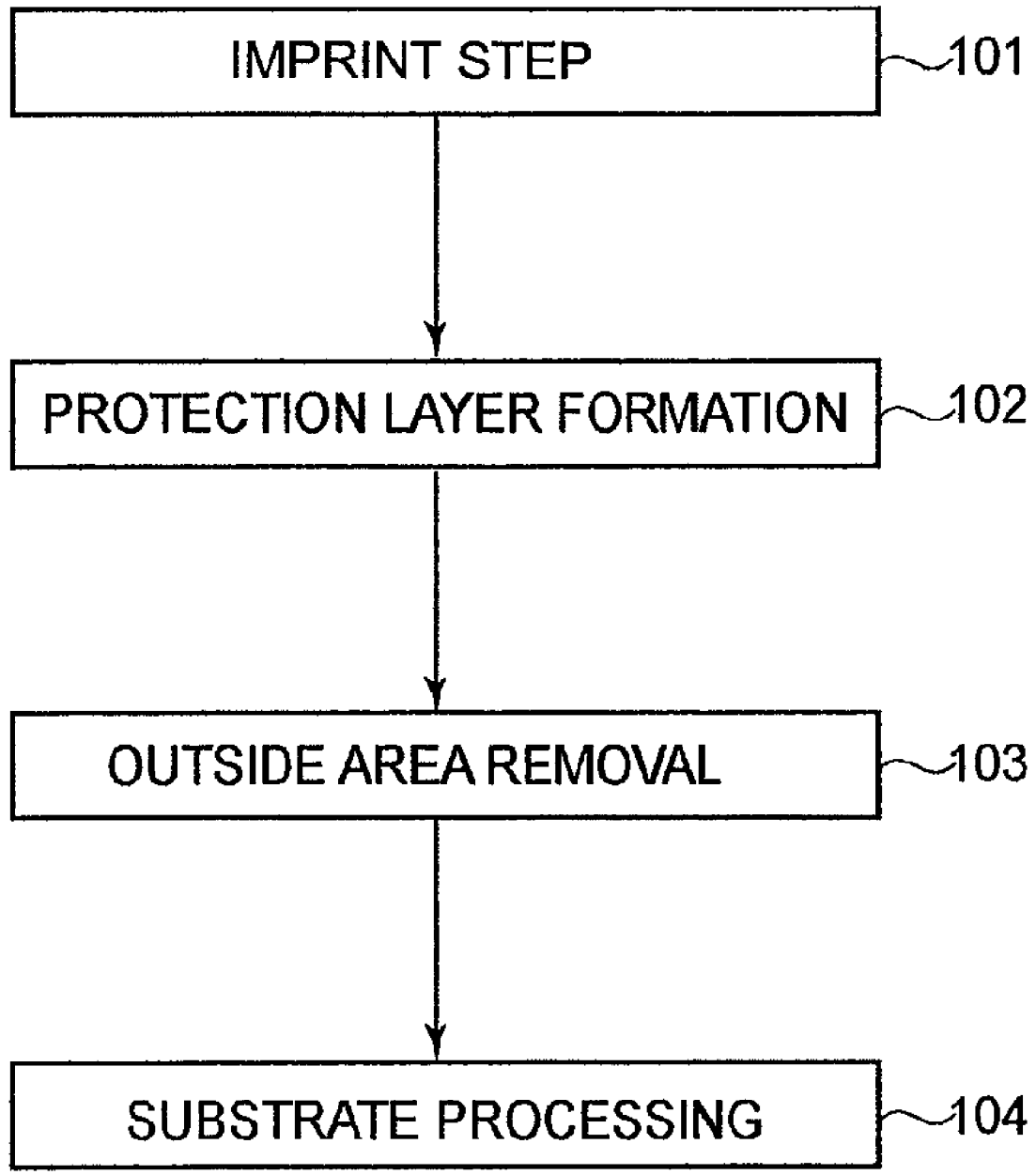
FIG. 1 is a flow chart of an imprinting method in Embodiment 1 of the present invention.

Embodiments of the present invention will now be described with reference to the drawings. In the respective figures, identical or corresponding portions are represented by identical reference numerals or symbols.

(Embodiment 1)

FIG. 1 and FIGS. 2A to 2E illustrate an imprinting method in this embodiment.

Figure 2A:
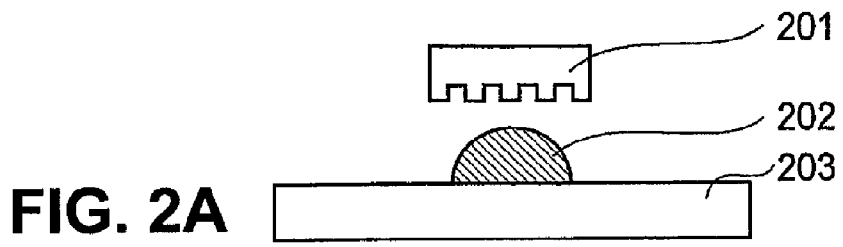
FIGS. 2A to 2E are schematic views for illustrating imprinting steps in Embodiment 1 of the present invention.
Figure 2B:
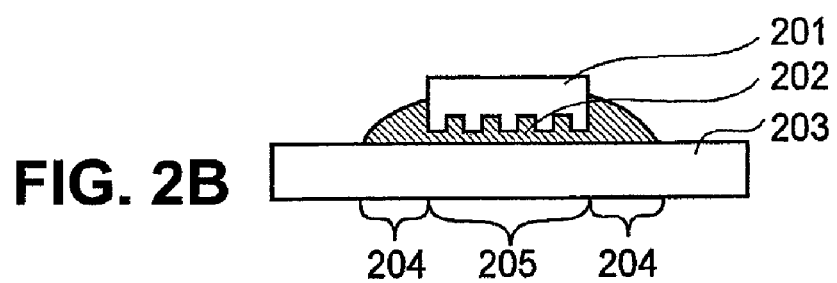
Figure 2C:
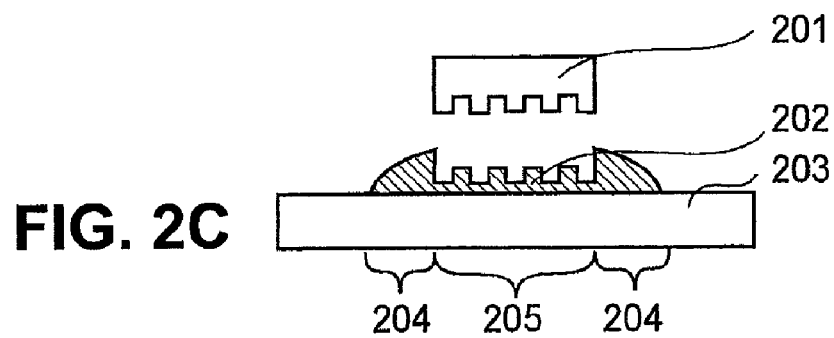
Figure 2D:
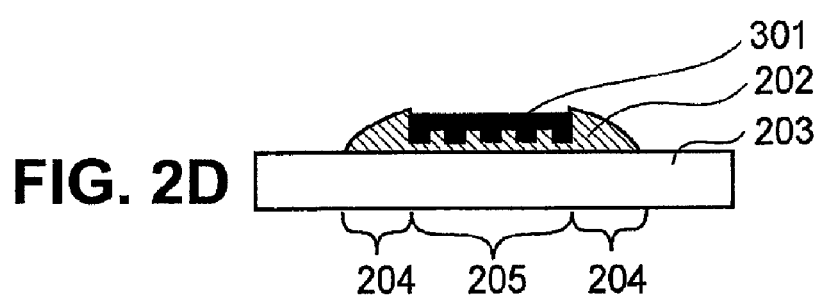

Referring to FIG. 1, in step 101, a pattern of a mold is transferred onto a resin material layer formed on a substrate. Specifically, as shown in FIG. 2A, a resin material layer 202 is formed on a substrate 203. Thereafter, as shown in FIG. 2B, a mold 201 is brought into contact with the resin material layer 202, and then, the resin material layer 202 is cured. At this time, a portion of the resin material layer 202, pressed out of a processed area 205 by the mold 201, is formed in an outside area (extrusion area) 204. Then, as shown in FIG. 2C, the mold 201 is separated from the resin material layer 202, so that the pattern on the mold 201 is transferred onto the resin material layer 202. By this, a first layer of the resin material is formed on the substrate both in the processed area 205, in which the imprinting pattern corresponding to the pattern of the mold is formed and the outside area 204 surrounding the entire periphery of the processed area 205.

The mold 201 has a desired pattern at its surface and is formed of a material such as silicon, quartz, or sapphire. The surface where the pattern is formed is subjected to ordinary parting processing using a fluorine-based silane coupling agent, or the like. Herein, the mold having such a parting layer formed by the parting processing is inclusively referred to as the "mold".

As a material for the resin material layer 202, it is possible to employ acrylic or epoxy photocurable resin material, thermosetting resin material, thermoplastic resin material, or the like.

Referring again to FIG. 1, in step 102, the outside area of the resin material layer formed in step 101 is utilized as a side wall to form a protection layer or a first layer or an original layer in the processed area. Specifically, as show in FIG. 2D, the side wall of the resin material layer 202, formed at a boundary between the processed area 205 and the outside area 204, is used as a boundary wall to form a protection layer 301, so as to protect the resin material layer 202 in the processed area 205.

The protection layer 301 is formed of a material capable of enduring an etching election ratio with the resin material layer 202. That is, the protection layer 301 is formed of a material capable of protecting the resin material layer in the processed area 205 at the time of etching, in step 103, in which the resin material layer in the outside area is removed. The material for the protection layer 301 can be selected from a silicon-based material, such as $SiO_2$ or SiN, a silicon containing resin material, an insulating film of $TiO_2$, $Al_2O_3$, or the like, and an ordinary metal material.

Figure 2E:
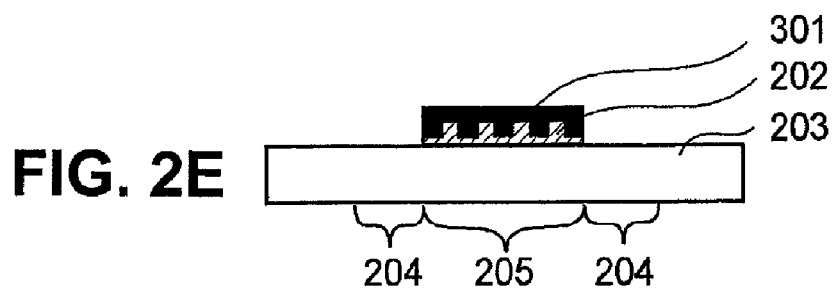

Referring again to FIG. 1, in step 103, the resin material layer in the outside area 204 is removed in a state in which the resin material layer in the processed area 205 is protected by the protection layer 301 formed in step 102. Specifically, as shown in FIG. 2E, the resin material layer 202 in the outside area 204 is removed by etching through the protection layer 301 formed on the resin material layer 202 in the processed area 205 as a mask.

In this removal step, e.g., when $SiO_2$ is used for the protection layer 301, it is possible to use $O_2$-based gas, such as $O_2$, $O_2/Ar$, $O_2/N_2$, or the like, as a gas system for etching the resin material layer. It is also possible to use a mixture gas system of three gases of $N_2$, $H_2$ and $NH_3$. Further, it is possible to use fluorocarbon-based gas, such as $CF_4$, $CHF_3$, $C_2F_6$, $C_3F_8$, $C_4F_8$, $C_5F_8$, or $C_4F_6$.

For example, when the resin material layer 202 is formed of an acrylic photocurable resin material and the protection layer 301 is formed of a silicon oxide compound, an etching selection ratio can be 50 or more by using $O_2$ as an etching gas. Therefore, it is possible to etch the resin material layer 202 by using the protection layer 301 as the mask.

Finally, in step 104 shown in FIG. 1, after the protection layer 301 is removed, the imprint pattern formed in the processed area 205 is transferred onto the substrate 203. It is also possible to process the substrate 203 with the protection layer 301 as the mask, by exposing the projection of the resin material layer through the etch back process, without removing the protection layer 301.

In this embodiment, it is desirable that the resin material layer 202 and the protection layer 301 are formed in the steps 101 and 102, so that only the resin material layer in the processed area 205 is protected by the protection layer 310 in step 103. That is, when the protection layer 301 is formed in step 102, the protection layer 301 is formed by adjusting the resin material layer in the outside area 204 and the protection layer 301, so that the protection layer 301 can protect the entire processed area 205, without extending into the outside area 204 through the boundary wall.

As a method of forming the resin material layer 202 on the substrate 203, it is possible to apply an ink jet method, a dropwise application method using a dispenser, a spin coating method, or the like.

When the resin material layer is formed in the outside area 204, as shown in FIG. 2B, it is desirable that the wall (a portion having a thickness larger than that in the processed area) of the resin material layer 202 enclose the entire processed area 205.

Further, the above-described boundary wall may desirably be formed with a height sufficient to retain the protection layer 301 on the resin material layer in the processed area 205.

In order to form the resin material layer 202 in the outside area 204, so as to surround the resin material layer 202 in the processed area 205 with a minimum outside area, the following method can be employed. For example, when the resin material is filled between the mold 201 and the resin material layer 202, it is possible to employ a method in which the resin material is extruded into a peripheral portion of the mold 201 in a uniform amount.

Figure 3A:
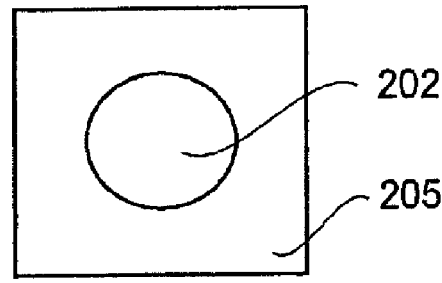
FIGS. 3A to 3C are schematic views for illustrating the formation of an outside area in Embodiment 1 of the present invention.
Figure 3B:
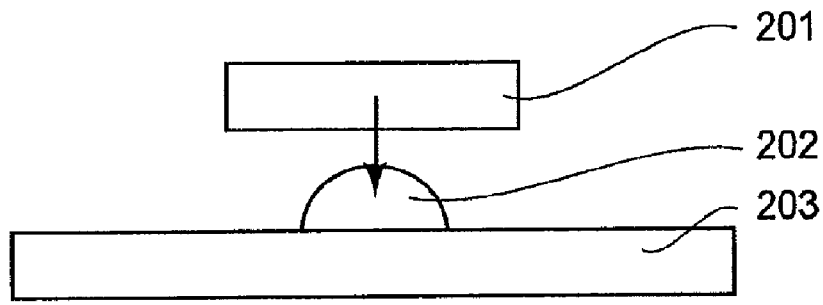
Figure 3C:
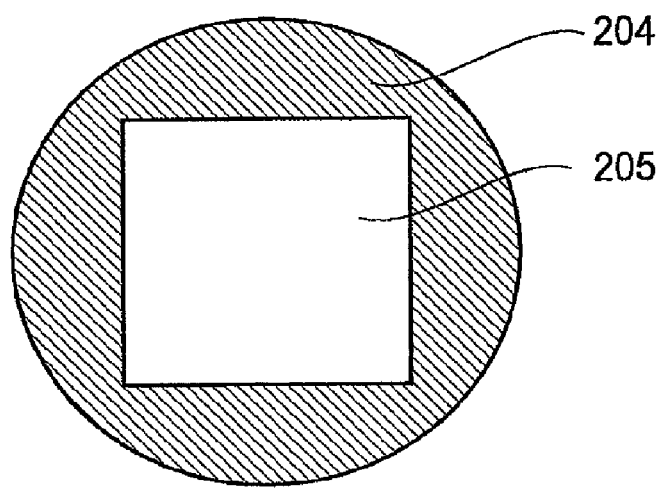

FIGS. 3A to 3C are schematic views for illustrating the method of extruding the resin material in the peripheral portion of the mold 201 in the uniform amount. For simplicity of explanation, a case when a flat mold is disposed opposite to a substrate and imprinting is performed with the flat surface relative to the substrate surface will be described as an example.

FIG. 3A illustrates an example of an arrangement of a resin material for application. As shown in FIG. 3A, a drop of the resin material is applied onto a substrate at a central portion of a processed area 205.

Next, as shown in FIG. 3B, a mold 201 is brought into contact with a resin material layer 202, in a state in which a pattern surface of the mold 201 and a surface of a substrate 203 are disposed opposite to each other. By this method, the resin material can flow symmetrically with respect to the center of the processed area 205.

As a result, as shown in FIG. 3C, the resin material layer can be formed in an outside area 204, so as to enclose the entire processed area 205.

Incidentally, there is the case in which flow of the resin material is not constant due to, e.g., a transfer pattern having such a shape that the flow of the resin material is accelerated in a certain direction with, e.g., a lattice arrangement, such that parallel grooves or vertical grooves are formed at different pitches. In such a case, the resin material in a uniform amount is caused to extrude into the periphery of the mold 201, by employing a manner of arrangement of resin material droplets or contact of the mold 201 with the resin material, in view of the nonconstant flow of the resin material, e.g., by employing such a manner of arrangement that a plurality of resin material droplets is arranged in a direction in which the resin material is less liable to extend. Further, in order to form a wall with a height necessary to retain the protection layer 301 on the resin material layer in the processed area 205, a sufficient amount of the resin material is applied, as described below.

Next, the necessary height of the boundary wall in the outside area will be described.

Figure 4:
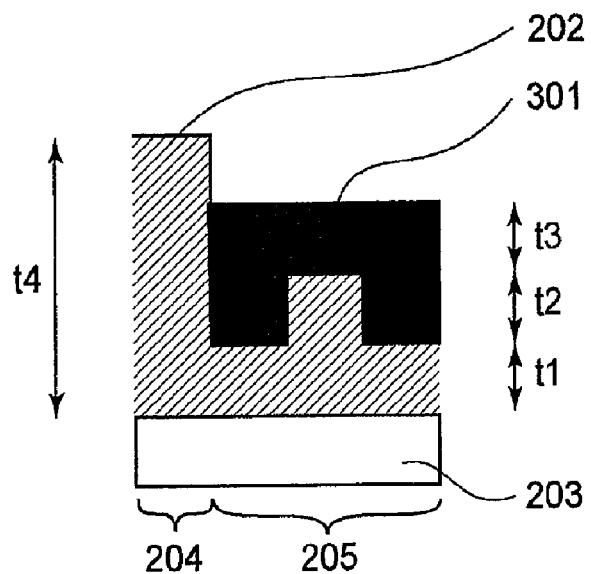
FIG. 4 is a schematic view for illustrating a necessary height of a boundary wall in the outside area in Embodiment 1 of the present invention.

FIG. 4 is a schematic view for illustrating the necessary height of the boundary wall in the outside area in this embodiment. This Figure is an enlarged view showing the neighborhood of the outside area 204 shown in FIG. 2D, in order to explain the necessary height of the wall of the resin material layer 202 in the outside area 204.

In FIG. 4, t1 represents a thickness of a residual film of the resin material layer 202, t2 represents a pattern height of the resin material layer 202, t3 represents a thickness of the protection layer 301 (a second layer), and t4 represents a height of the resin material layer 202 in the outside area 204.

In order that the protection layer 301 protects only the resin material layer in the processed area 205 and does not extend to the resin material layer in the outside area 204, the above thicknesses are set to satisfy the following relationship: t4>t1+t2+t3. For example, in the case when t1 is 100 nm, t2 is 100 nm and t3 is 100 n, t4 is set to be larger than 300 nm.

In this case, when the surface of an end portion of the protection layer 301 rises by about 3 μm along the side wall of the resin material layer in the outside area 204 due to surface tension, t4 is set to, e.g., about 4 μm, in view of the rise due to the surface tension.

Further, e.g., in the case of t1=100 nm, t2=100 nm, and t3=1 μm, t4 is set to be larger than 1.2 μm. Also, in this case, similarly in view of the surface tension, t4 may preferably be about 5 μm. At that time, the necessary height varies depending on physical properties of the protection layer 301.

Next, an amount of the resin material necessary to form the above-described boundary wall with a height capable of retaining the protection layer on the resin material layer in the processed area will be described.

Figure 5A:
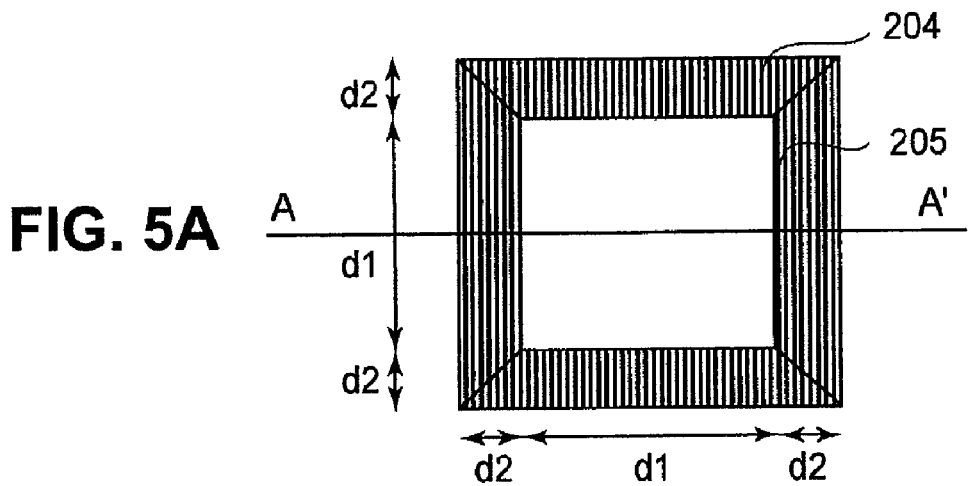
FIGS. 5A and 5B are schematic views for illustrating an amount of a resin material required for forming a boundary wall for retaining a protection layer in a processed area.
Figure 5B:
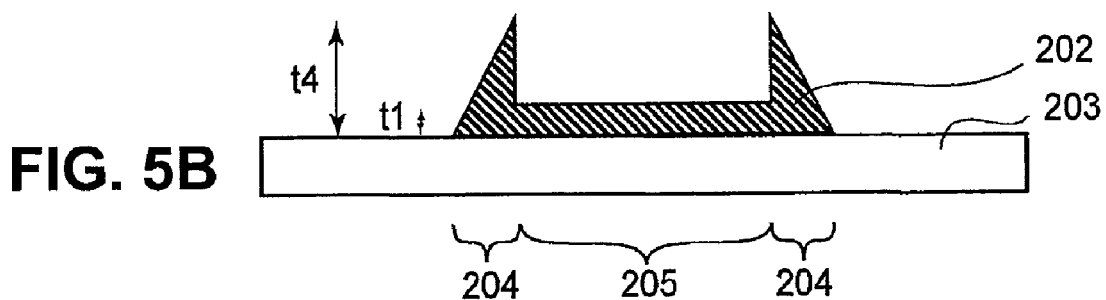

FIGS. 5A and 5B are schematic views for illustrating the amount of resin material necessary to form the boundary wall capable of retaining the protection layer on the resin material layer in the processed area 205 in this embodiment. In FIG. 5A, d1 represents a width of the processed area 205 and d2 represents a width of the outside area 205. FIG. 5A is a top view of the resin material layer 202 formed in the step 102. For simplicity of explanation, in this example, a square-shaped outer boundary of the outside area 204 is present outside a square-shaped processed area 205. Further, the shape of the imprinting pattern of the mold is omitted from the illustration. FIG. 5B is a sectional view taken along line A-A' shown in FIG. 5A.

In this case, a necessary resin material amount V is set to satisfy the following equation:

$$V = t_1 d_1^2 + 2 t_4 d_1 d_2 + \frac{4}{3} t_4 d_2^2.$$

For example, by applying the resin material onto the substrate in an amount calculated from the above equation, it is possible to form the boundary wall with a height necessary to retain the protection layer on the resin material layer in the processed area 205. In order to form the boundary wall with the necessary height with a higher accuracy, it is necessary to add a resin material amount corresponding to the imprinting pattern of the mold to the amount V.

Next, a protection layer forming method will be described.

As described above, it is desirable that the protection layer be formed on the resin material layer only in the processed area 205. As the protection layer forming method, it is possible to employ, e.g., application with a dispenser, multi-point application in a small amount by an ink jet method, application by spray coating, and deposition using a mask designed to expose only the processed area 205. The mask may also be used in the application by spray coating.

In a case when the protection layer flows out and extrudes from the processed area after the resin material layer in the outside area is removed in a subsequent step, it is necessary to place the protection layer in a state in which the protection layer is not flowable after the protection layer is formed by the application or the deposition. For example, when a material for forming the protection layer is applied in a state in which the material is dissolved in a solvent, the solvent is vaporized under heating, or the like.

Further, in a reverse process described later, in order to use the protection layer as a mask by etching back the protection layer, the thickness of the protection layer may preferably be uniform. This is because there is a possibility that the pattern disappears in the case of the non-uniform thickness. In order to form the protection layer in the uniform thickness, e.g., a material which is easily made wet with respect to the resin material layer 202, and has a low viscosity, is used for the protection layer. Specifically, by applying the material for the protection layer in a state that the material has a contact angle with respect to the resin material layer of ninety degrees or less, and a viscosity of twenty cp or less, the protection layer spontaneously flows in the entire processed area 205, to spontaneously make uniform the thickness thereof. Further, in order to form the uniform protection layer, the protection layer may also be pressed and extended by a flat plate. Specifically, it is also possible to effect imprinting of the protection layer with a flat mold free from an imprinting pattern by using a photocurable resin material as the material for the protection layer.

In this case, it is necessary to select the respective materials so as to ensure a proper etching election ratio between the resin material layer 202 and the protection layer 301.

By forming the resin material layer 202 and the protection layer 301 as described above, in step 102, it is possible to form the protection layer 301 so as to protect the resin material layer 202 in the entire processed area, without extruding from the processed area 205.

(Embodiment 2)

In Embodiment 2, a substrate processing method for processing a substrate so that a pattern is formed on the substrate through a single layer process by using the imprinting method of the present invention will be described with reference to FIGS. 6A to 6D.

Figure 6A:
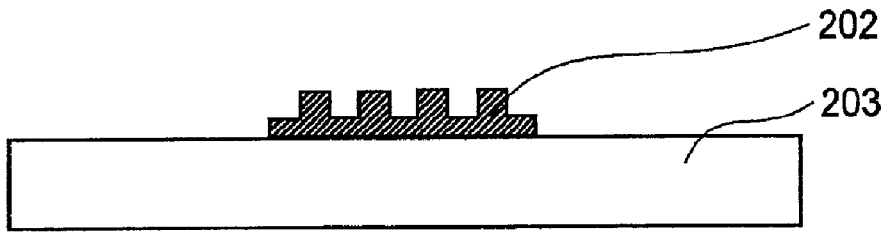
FIGS. 6A to 6D are schematic views for illustrating substrate processing steps for processing a substrate by a single layer process in Embodiment 2 of the present invention.

A step shown in FIG. 6A is a second layer removal step for removing the second layer, which is the protection layer 301. In this step, only the protection layer 301 is removed from a state in which the protection layer 301 is formed on the resin material layer 202, as shown in FIG. 4. In order to remove the protection layer 301, e.g., when an $SiO_2$-based material is used as the material for the protection layer 301, wet etching using hydrofluoric acid is employed.

Figure 6B:
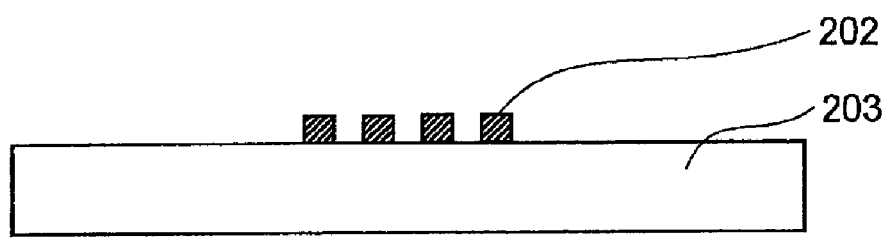
Figure 6C:
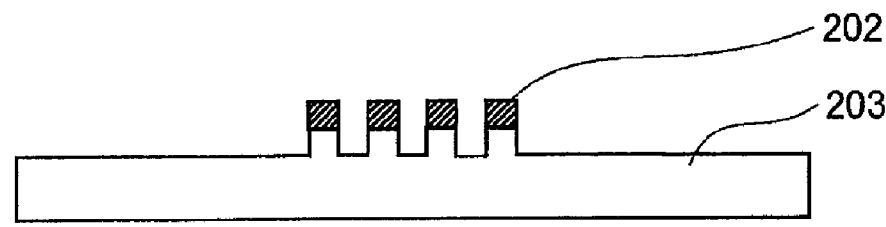

Next, as shown in FIG. 6B, a residual film of the resin material layer 202 is removed by etching back the resin material layer 202. Then, as shown in FIG. 6C, the substrate is etched through the resin material layer 202 as a mask.

Figure 6D:
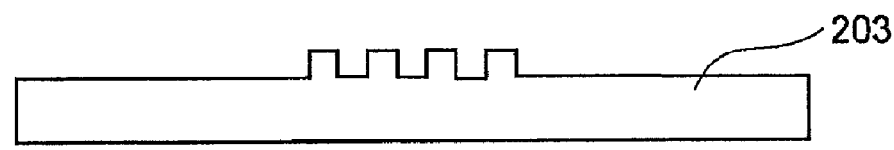

Finally, as shown in FIG. 6D, the resin material layer 202 used as the mask is removed.

Through the steps described above, it is possible to process the substrate so as to have a desired imprint pattern in a state in which the resin material layer in the outside area is removed.

(Embodiment 3)

In Embodiment 3, a substrate processing method for processing a substrate so that a pattern is formed on the substrate through a reverse processing by using the imprinting method of the present invention will be described. FIGS. 7A to 7D are schematic views for illustrating substrate processing steps for processing the substrate so as to form a pattern through the reverse process in this embodiment. In this embodiment, by using the above-described material capable of ensuring the etching selection ratio with the resin material layer 202 as the material for the protection layer 301, it is possible to utilize the protection layer 301 as a reverse layer. For example, when an acrylic photocurable resin material is used for the resin material layer 202, a silicon oxide compound is used for the protection layer 301.

Figure 7A:
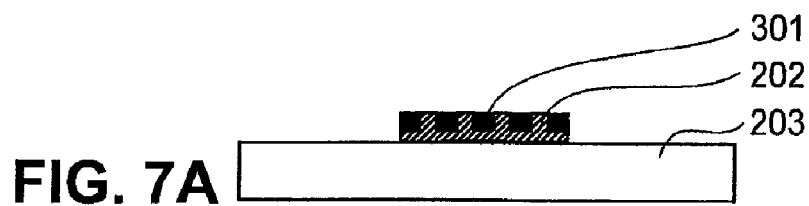
FIGS. 7A to 7D are schematic views for illustrating substrate processing steps for processing a substrate by a reverse process in Embodiment 3 of the present invention.

As shown in FIG. 7A, a projection of a resin material layer 202 is exposed by etch back of a protection layer 301 from a state in which the protection layer 301 is formed on the resin material layer 202.

Figure 7B:
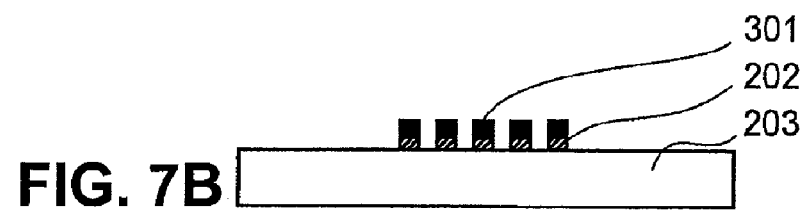

Next, as shown in FIG. 7B, the resin material layer 202 is etched through the protection layer 301 as a mask.

Figure 7C:
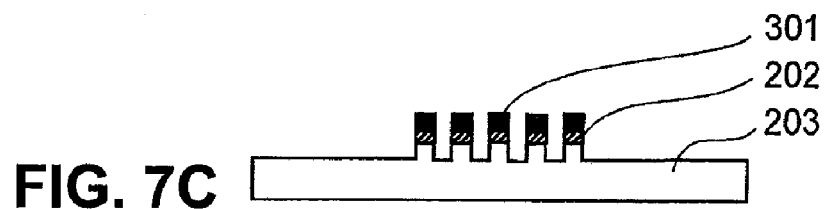
Figure 7D:
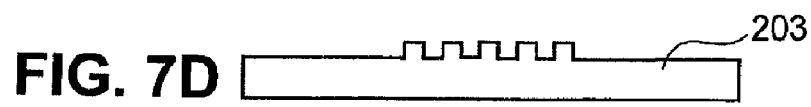

Next, as shown in FIG. 7C, a substrate 203 is etched through the protection layer 301 and the resin material layer 202 under the protection layer 301 as a mask.

Next, the protection layer 301 and the resin material layer 202 as the mask are removed.

Through the steps described above, in a state in which the resin material layer in the outside area is removed, a desired imprinting pattern can be formed on the substrate by the processing method in this embodiment.

In the processing method using the reverse process, a residual film of the resin material layer is not removed, different from the case of the single layer process in which the residual film is removed by the etch back of the resin material layer 202 itself, so that it is possible to retain an edge shape of an upper portion of the pattern. By this, compared with the single layer process, it is possible to further improve the transfer accuracy.

(Embodiment 4)

In the case of using imprinting for semiconductor lithography, a step-and-repeat method, in which pattern transfer onto a substrate is repeated by using a mold in a size smaller than a size of the substrate, is suitable. This is because it is possible to improve the accuracy by reducing an integral error of alignment and a mold pattern itself, due to an increase in wafer size. Further, it is possible to reduce a production cost of the mold by the increase in the wafer size.

However, the above-described imprinting method involves a problem such that it is difficult to produce a device having a size larger than that of the mold.

Figure 8:
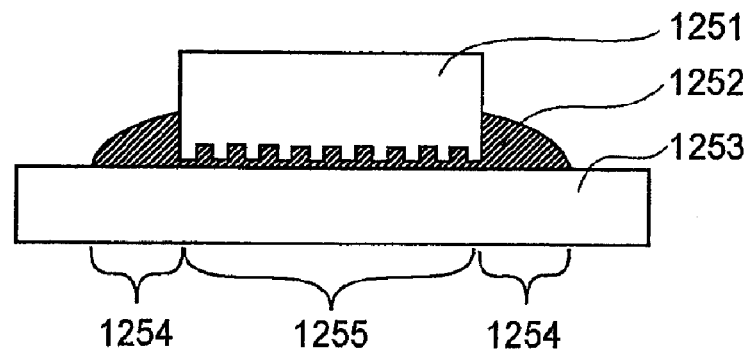
FIG. 8 is a schematic view for illustrating a conventional imprinting method.

That is, as shown in FIG. 8, when imprinting for one shot is performed on a substrate 1253 by processing the substrate 1253, a resin material 1252 can be pushed out of a shot area to form an outside area 1254 along an edge of a mold 1251. The thus formed outside area 1254 has a width that is generally larger than a size of the pattern or a period of the pattern. Further, the thickness of the resin material layer in the outside area 1254 is larger than that in the shot area (processed area) 1255, in many cases. For example, the thickness of the resin material layer and an unevenness of the pattern in the processed area 1255 is about several tens of nm to about several hundreds of nm, whereas the thickness of the resin material layer in the outside area 1254 can be several μm or more.

In such an outside area 1254, it is difficult to form the pattern and, therefore, a gap corresponding to at least the width of the outside area 1254 is created between adjacent shot areas. As a result, it is difficult to produce a large-size device by connecting patterns transferred from the pattern of the mold. Further, even in the case when the large-size device is not produced, there arises such a problem that the number of chips prepared from one wafer is decreased by the presence of the outside area 1254 to increase the production cost.

In view of such a problem, an imprinting method and a processing method in this embodiment, which are capable of connecting patterns of adjacent processed areas to each other to reduce the production cost, will now be described.

Figure 9:
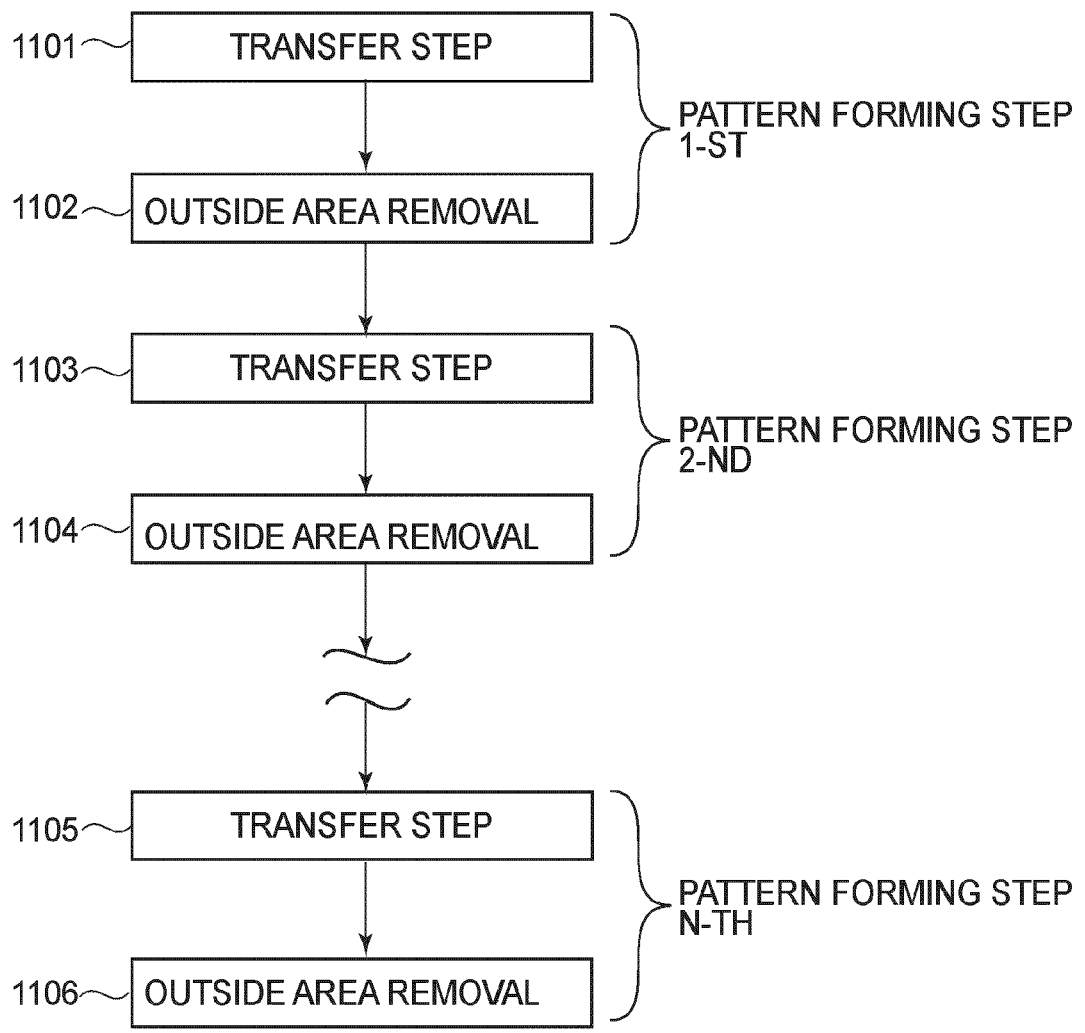
FIG. 9 is a flow chart of an imprinting method in Embodiment 4 of the present invention.

FIG. 9 is a flow chart of the imprinting method in this embodiment.

Step 1101 is a first transfer step, in which imprinting for transferring a pattern of a mold onto a resin material layer formed on a substrate is performed once or multiple times by the step-and-repeat method to form a first processed area.

Step 1102 is a first removal step, in which the resin material extruded in step 1101 from the first processed area into a peripheral portion in an outside area is removed. By this, a first pattern is formed.

In this way, the pattern forming step in this embodiment, as described above, consists of a series of the transfer step and the removal step for removing the resin material layer in the outside area, after the transfer step.

Step 1103 is a second transfer step for forming a second processed area. In this step, an imprinting step is performed, so that the second processed area overlaps with the outside area from which the resin material layer is removed in step 1102.

Step 1104 is a second removal step in which the resin material extruded from the second processed area into a peripheral portion in an outside area in step 1103 is removed. By this, a second pattern is formed.

In this way, by repeating multiple times the pattern forming step consisting of the series of the transfer step and the removal step, also in a third pattern forming step or later, it is possible to transfer the pattern onto the resin material layer even in the once created outside area.

In FIG. 9, step 1105 is an N-th transfer step and step 1106 is an N-th removal step.

In this embodiment, the case of performing the pattern forming step three times will be described.

Figure 10A:
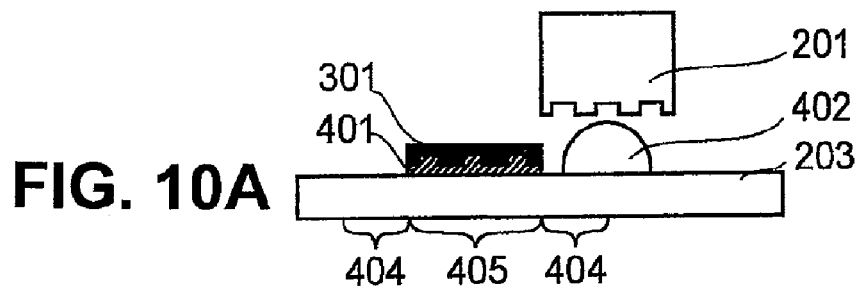
FIGS. 10A to 10E are schematic views for illustrating a second transfer step and a second removal step in Embodiment 4 of the present invention.

FIG. 10A is a schematic view showing a state after the first transfer step is performed through the steps shown in FIGS. 2A to 2E. On a resin material layer 401 formed in the first transfer step, a protection layer 301 (first protection layer) is formed. An area 404 is an outside area in the first transfer step and an area 405 is a processed area in the first transfer step.

As shown in FIG. 10A, a resin material layer 402 is formed on a substrate 203. At this time, a mold 201 and the resin material layer 402 are disposed so that a processed area 407 in an imprinting step of a second transfer step overlaps with the outside area 404 in the first transfer step.

Figure 10B:
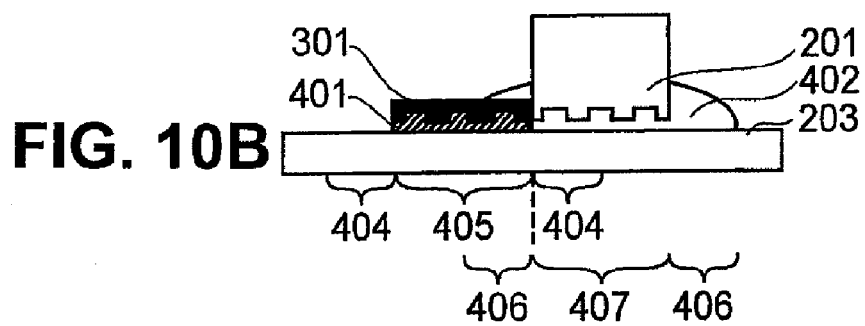

As shown in FIG. 10B, the mold 201 is brought into contact with the resin material layer 402 to fill the resin material layer 402 between the mold 201 and the substrate 203. At this time, a portion of the resin material layer 402 extruded from the processed area 407 by the mold 201 is also extruded onto the protection layer 301 in the processed area 405 in the first transfer step.

Figure 10C:
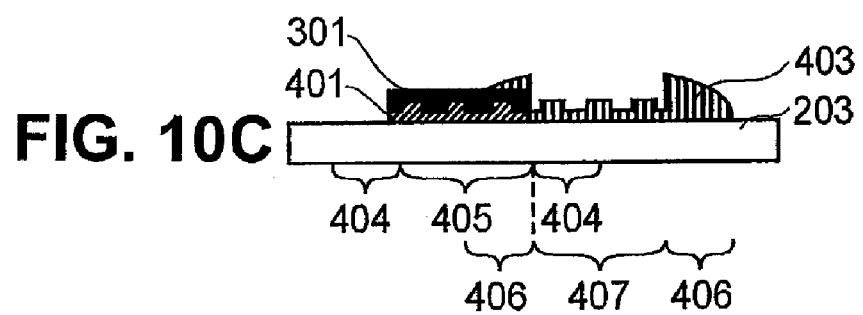

As shown in FIG. 10C, after the resin material layer 402 is cured, the mold 201 is separated from a cured resin material layer 403, so that the pattern on the mold 201 is transferred onto the resin material layer 403.

Figure 10D:
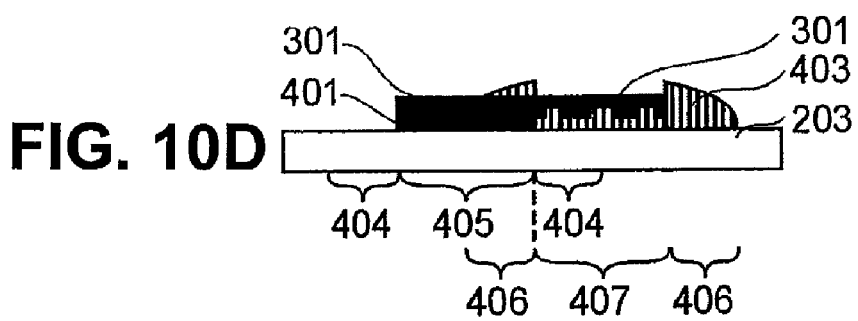
Figure 10E:
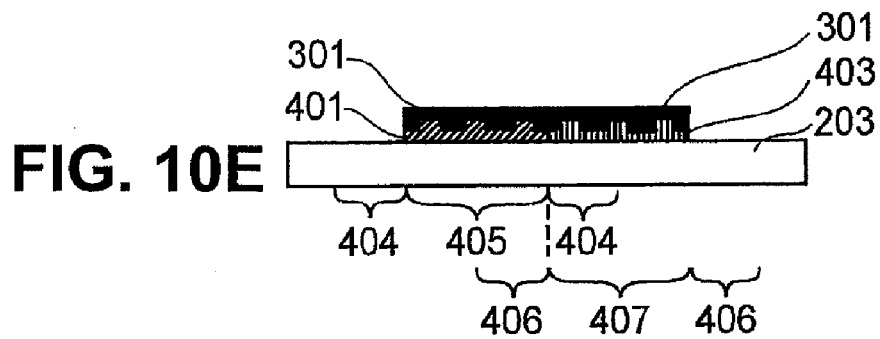

As shown in FIGS. 10D and 10E, similarly as in the first removal step, only the resin material layer 403 in an outside area 406 is removed while the resin material layer 403 in the processed area 407 and the resin material layer 401 in the processed area 405 are protected by a protection layer 301 (second protection layer).

By performing the above-described steps, it is possible to transfer the pattern on the resin material layer also in such an area that the resin material layer is originally extruded from the processed area and the pattern cannot otherwise be transferred on the resin material layer in the area.

By this, it is possible to reduce the gap between adjacent processed areas and to connect patterns in the adjacent processed areas to each other.

Generally, in order to realize the gap reduction and the pattern connection, it is necessary to effect (positional) alignment between the mold 201 and the substrate 203 with an accuracy comparable to the accuracy of the gap reduction of the pattern connection.

Similarly, also in the third pattern forming step, a pattern is transferred in a state in which a third processed area is superposed on the outside area in the preceding step, and then, only the resin material layer in the outside area is removed.

Next, the imprinting method for performing the pattern forming step three times will be described more specifically.

Figure 11A:
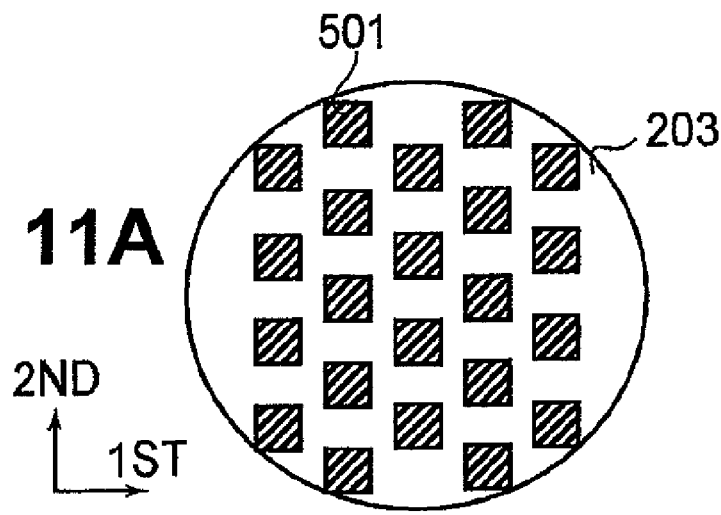
FIGS. 11A to 11C are schematic views for illustrating an arrangement of processed areas in respective transfer steps in an imprinting method for repeating a pattern forming step in Embodiment 4 of the present invention.
Figure 11B:
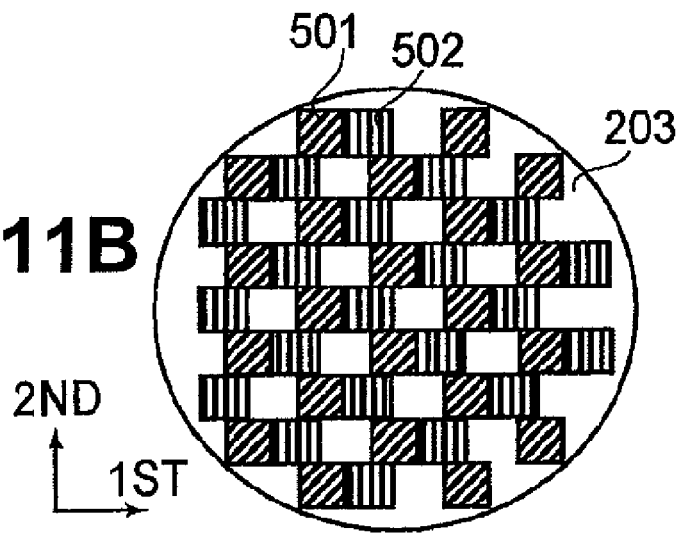
Figure 11C:
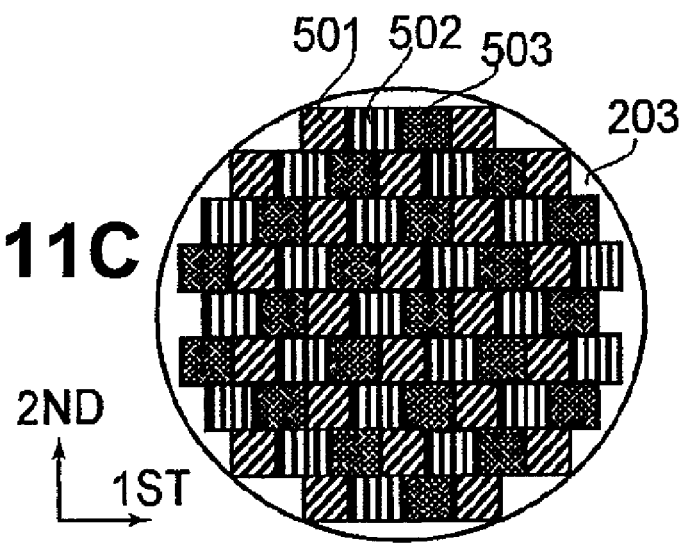

FIGS. 11A to 11C are top views for illustrating an arrangement of processed areas in transfer steps in the imprinting method for performing the pattern forming step three times. Reference numeral 501 represents a processed area (first processed area) in a first transfer step, reference numeral 502 represents a processed area (second processed area) in a second transfer step, and reference numeral 503 represents a processed area (third processed area) in a third transfer step.

FIG. 11A shows an arrangement of the processed area (first processed area) in the first transfer step in a first pattern forming step. With respect to an arrangement in a first direction (1ST) in FIG. 11A, an interval between adjacent processed areas with respect to the first direction is an integral multiple of, e.g., two times, a width of the processed area with respect to the first direction. The "two times" the width of the processed area means "two times" the width of the processed area to which an adjusting amount of a mold processing error and a mold alignment error are added, and in the following description, similar meanings are applied.

With respect to an arrangement in a second direction (2ND) perpendicular to the first direction (1ST), each processed area is moved in the first direction by a distance that is one time the processed area width and is moved in the second direction by a distance that is, e.g., 1.5 times the processed area width. The distance of the movement of each processed area in the second direction is not limited to 1.5 times the processed area width, but is at least a distance that is the sum of the processed area width and a width of the outside area, and at most, a distance obtained by subtracting the outside area width from a length that is two times the processed area width.

FIG. 11B shows an arrangement of the processed areas 502 in the second transfer step in a second pattern forming step. With respect to the first direction in FIG. 11B, the processed areas 502 are disposed adjacently to the processed areas 501 arranged in the first transfer step.

FIG. 11C shows an arrangement of the third processed areas 503 in the third transfer step in a third pattern forming step. With respect to the first direction in FIG. 11C, the third processed areas 503 in the third transfer step are disposed between the first processed areas 502 and the second processed areas 502 in the first and second transfer steps.

By arranging the processed areas as in this embodiment, it is possible to transfer a pattern on substantially the entire substrate 203, by repeating the pattern forming step three times.

Also, in the case of repeating the pattern forming step three times or more, an interval between adjacent processed areas of the plurality of processed areas is set to a length obtained by multiplying a length of the processed area width by the number of repeated pattern forming steps performed after completion of the first pattern forming step, so that the pattern can be similarly transferred onto substantially the entire substrate. However, generally speaking, in the transfer step and the removal step in the pattern forming step, it is necessary to exchange an apparatus being used. For this reason, in order to improve the throughput of the processing method, the number of repeatedly performed pattern forming steps may preferably be small.

By arranging the processed areas as in this embodiment, it is possible to reduce a gap between adjacent processed areas with respect to all the adjacent processed areas and to connect patterns of all the processed areas to each other only through a three-time repetition of the pattern forming step.

FIGS. 11A to 11C illustrate an example of this embodiment. Therefore, the number of imprinting steps in each transfer step, or the like, varies, depending on the sizes or the shapes of the mold and the substrate.

Figure 12A:
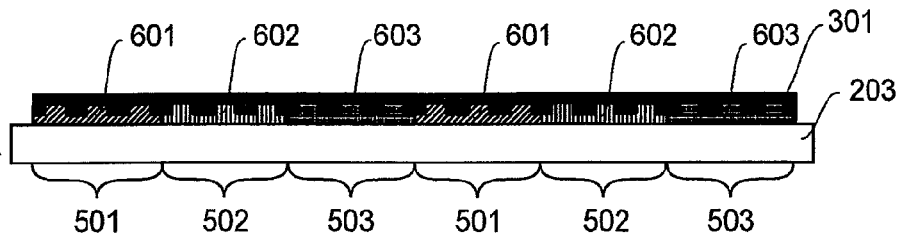
FIGS. 12A and 12B are schematic views for illustrating an arrangement of processed areas in Embodiment 4 of the present invention.

FIG. 12A is a sectional view showing a stage after completion of step 1106 of FIG. 9, with respect to the first direction, in FIGS. 11A to 11C. In FIG. 12A, on the substrate 203, a resin material layer 601 formed in the first transfer step, a resin material layer 602 formed in the second transfer step, and a resin material layer 603 formed in the third transfer step are disposed. As shown in FIG. 12A, the first processed area 501, the second processed area 502, the third processed area 503, and another first processed area 501 can be connected to each other.

In this embodiment, in each transfer step, as described above, an interval between adjacent processed areas with respect to the first direction in FIGS. 11A to 11C is two times the processed area width.

Figure 12B:
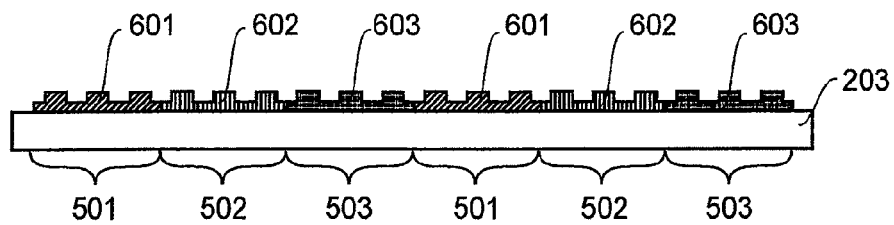

By this, through a three-time repetition of the pattern forming step, it is possible to connect the processed areas to each other with respect to the first direction. FIG. 12B shows a state in which only the protection layer 301 is removed from the state shown in FIG. 12A. The protection layer 301 is removed after the series of the transfer steps and the removal steps is performed.

Through the steps described above, it is possible to form the resin material layer on which a desired pattern is transferred.

In this embodiment, as described above, the transfer step and the removal step are performed alternately and repeated three times. Further, the processed areas in each transfer step are arranged as shown in FIGS. 11A, 11B, or 11C, so that it is possible to realize the gap reduction and the pattern connection with respect to all the adjacent processed areas. Further, even in the case when the patterns of adjacent processed areas are not connected to each other, the production cost can be reduced.

In this embodiment, it is desirable that an amount and a distribution of the resin material applied onto the substrate are controlled, so that the resin material in the processed area has a uniform thickness and a height of the resin material layer on the substrate surface in the outside area is a predetermined height. For example, in the imprinting step in the second transfer step, as shown in FIGS. 10A to 10C, the resin material layer 401 in the processed area 405, formed in the first transfer step, is located in the outside area 404. For this reason, the resin material extruded from the processed area 407 is influenced, so that the thickness of the resin material layer 403 in the processed area 407 can be increased, or the height of the wall of the resin material layer in the outside area 406 can be partly increased. For this reason, in the second transfer step, a total amount of the resin material to be applied may be adjusted so as to be less than that in the first transfer step. Further, the resin material may be distributed so that the amount of resin material at an adjacent portion of the processed areas in the first transfer step is small.

In this way, by adjusting the height of the wall of the resin material layer in the outside area and the thickness of the resin material layer in the processed area, it is possible to not only form the protection layer 301 only on the resin material layer in the processed area 405, but also, to alleviate lowering in transfer accuracy during pattern transfer onto the substrate described later.

Figure 13A:
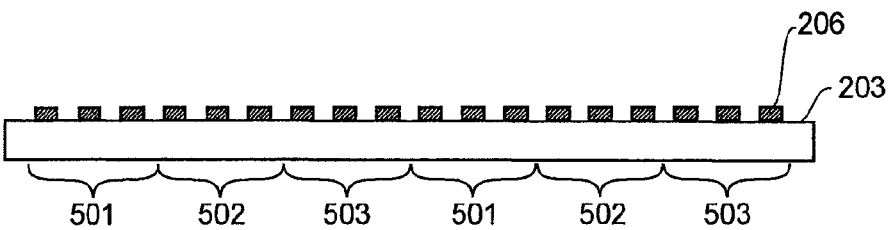
FIGS. 13A to 13C and FIGS. 14A to 14D are schematic views for illustrating transfer methods of a pattern onto a substrate in Embodiment 4 of the present invention.
Figure 13B:
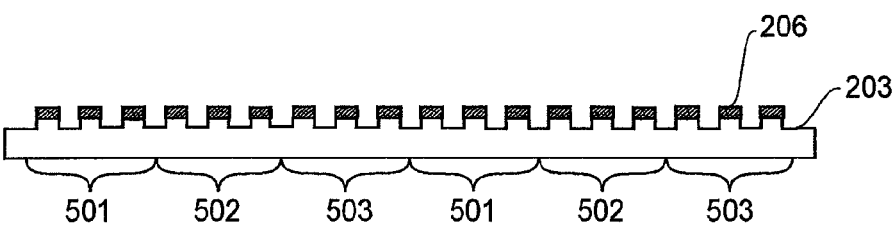
Figure 13C:
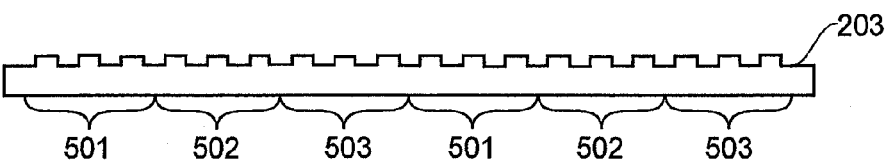

In this embodiment, it is also possible to transfer the pattern onto the substrate 203 through the resin material layer on which the pattern is transferred as the mask. FIGS. 13A to 13C are sectional views for illustrating a method therefor.

The resin material layer transferred on the substrate has a portion that is generally called the residual film as a ground work for the pattern.

FIG. 13A shows a state in which the residual film of the resin material layer 206 is removed. That is, the state is in a stage such that the thickness of the resin material layer on the entire substrate surface is uniformly reduced by etching until the residual film is eliminated from the state of FIG. 12B. Next, by using the remaining resin material layer 206 as the mask, the substrate is etched to form a state shown in FIG. 13B. Finally, by removing the remaining resin material layer 206, as shown in FIG. 13C, it is possible to transfer a desired pattern onto the substrate.

In this embodiment, the pattern transfer method onto the substrate is not limited to the above-described method, but may also be another substrate processing method. For example, FIGS. 14A to 14D are sectional views for illustrating another method of transferring the pattern onto the substrate 203.

Reference numeral 1001 represents a reverse layer. In this method, on the resin material layer, the reverse layer is formed of a material capable of ensuring an etching selection ratio with the resin material layer. As the material for the reverse layer, it is possible to employ a material similar to that for the reverse layer described above. When the reverse layer is formed on the resin material layer, a resultant state is the same as that of FIG. 12A, in which the protection layer is regarded as the reverse layer.

When the resin material layer removal step in the outside area is performed by using the above-described protection layer, it is possible to continue the processing step from the state of FIG. 12A, in which the protection layer is formed on the resin material layer. In this case, the protection layer is regarded as the reverse layer.

Figure 14A:
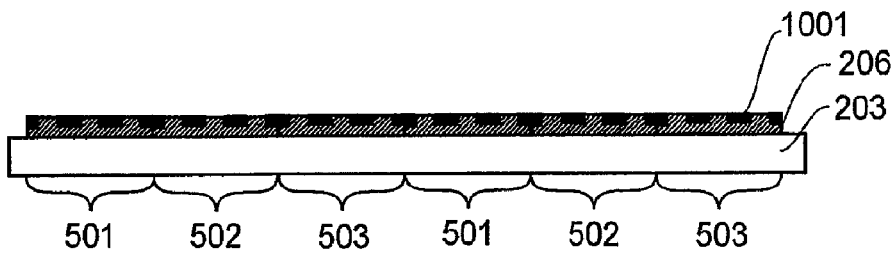

FIG. 14A shows a state in which the entire surface of the reverse layer 1001 is etched until a projection of the resin material layer 206 is exposed.

For example, when $SiO_2$ is used as the material for the reverse layer, as a gas system for etching the reverse layer, it is possible to use a fluorocarbon-based gas, such as $CF_4$, $CHF_3$, $C_2F_6$, $C_3F_8$, $C_4F_8$, $C_5F_8$, or $C_4F_6$.

Figure 14B:
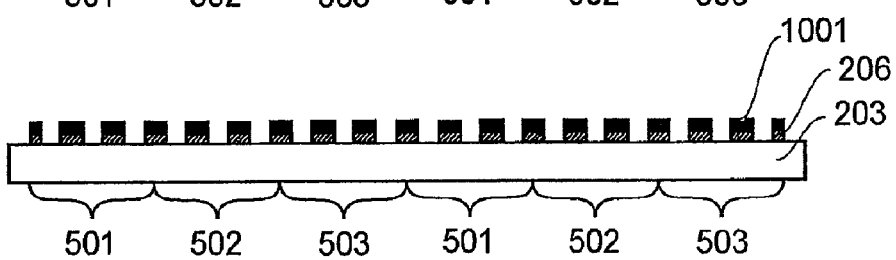
Figure 14C:
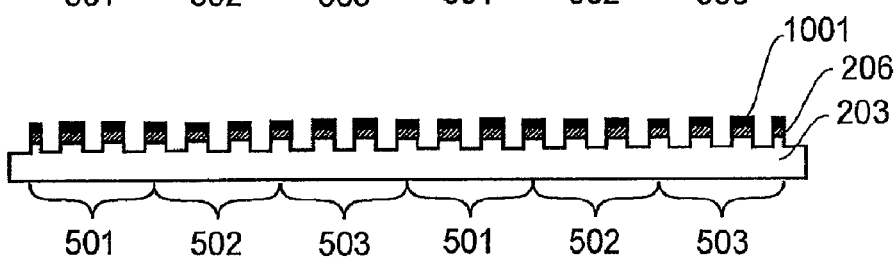
Figure 14D:
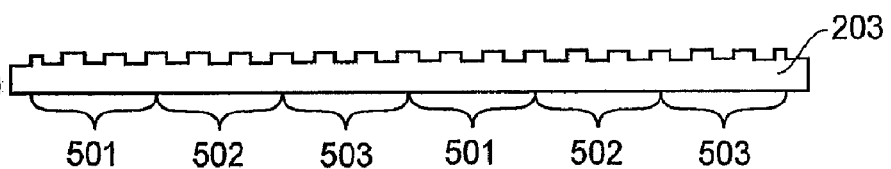

Next, when the resin material layer 206 is etched through the reverse layer 1001 embedded in a recess of the resin material layer 206 as the mask, a state shown in FIG. 14B is created. Next, when the substrate is etched through the reverse layer 1001 as the mask, a state shown in FIG. 14C is created. Finally, when the remaining reverse layer 1001 and the resin material layer 206 are removed, a state shown in FIG. 14D is created, so that it is possible to transfer a desired pattern onto the substrate.

In such a pattern transfer method onto the substrate using the reverse layer, the residual film of the resin material layer is not removed by the entire surface etching of the resin material layer 206 itself, so that it is possible to retain an edge shape of an upper portion of the pattern.

As a result, it is possible to improve the transfer accuracy by the method of etching the substrate through the resin material layer 206 as the mask.

Finally, the connection of the patterns of the respective processed areas in the present invention will be described.

Figure 15A:
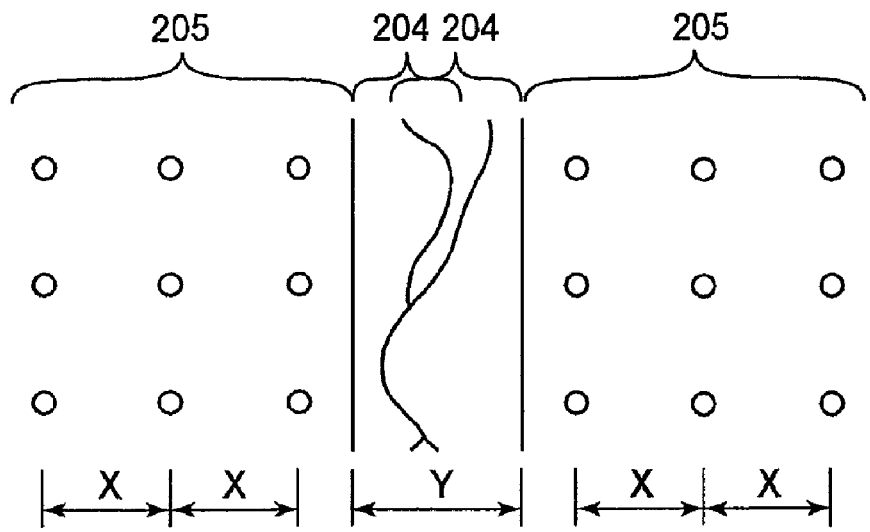
FIGS. 15A and 15B are schematic views for illustrating connection of the pattern in Embodiment 4 of the present invention.

For example, when a dot pattern with a pitch of X is transferred in the processed area 205, a state of FIG. 15A can be created in the case when the present invention is not applied. That is, when a width between adjacent processed areas in the outside area 204 is Y, the pitch is Y or more. In the case when Y is larger than X, or in the like case, it is difficult to set the pitch between the adjacent processed areas such as to be X.

Figure 15B:
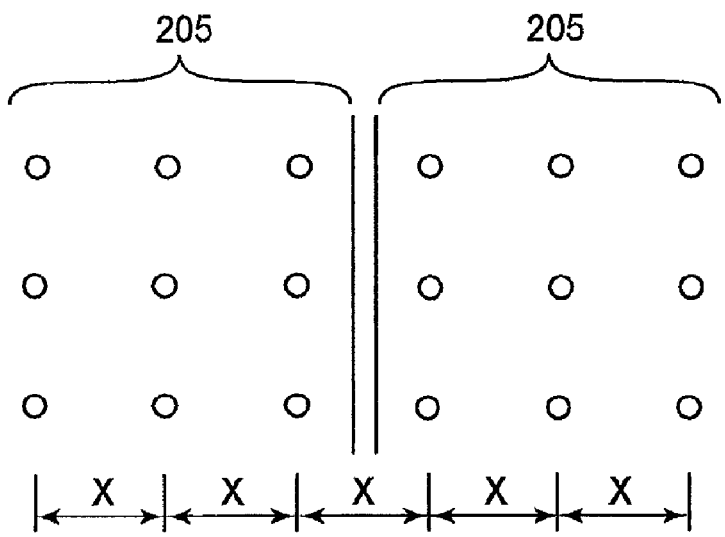

On the other hand, in the present invention, as shown in FIG. 15B, the pattern can also be formed in the outside area, to bring the adjacent processed areas near to each other, so that the pitch of the dot pattern between the adjacent processed areas can be set to X.

As described above, in this embodiment, it is possible to connect the patterns of the adjacent processed areas to each other. Such a processing method can be suitably used for a structure such as a photonic crystal, such that a distribution of a refractive index is arranged periodically with respect to an in-plane direction.

As the connectable pattern, in addition to the dot pattern, it is also possible to employ other patterns, such as a line-and-space pattern, a hole pattern, and a free pattern.

Further, in this embodiment, the shape of the mold in the processed area is not limited to a square, but may also be various shapes, such as a hexagon.

(Embodiment 5)

In Embodiment 5, an arranging method of processed areas different from that in Embodiment 4 will be described.

A difference of this embodiment from Embodiment 4 is an arranging manner of processed areas in each of the transfer steps and, therefore, only the difference will be explained.

With reference to FIGS. 16A to 16D, a method of repeating the pattern forming step four times will be described.

Reference numeral 1201 represents a processed area in a first transfer step, reference numeral 1202 represents a processed area in a second transfer step, reference numeral 1203 represents a processed area in a third transfer step, and reference numeral 1204 represents a processed area in a fourth transfer step.

Figure 16A:
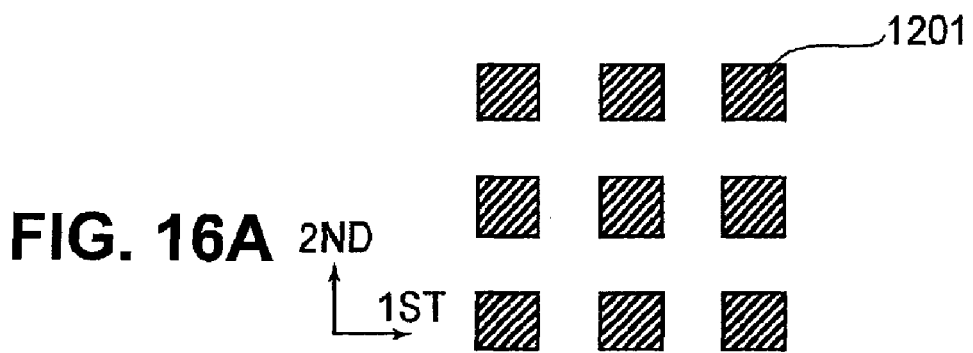
FIGS. 16A to 16D and FIGS. 17A and 17B are schematic views for illustrating arrangements of processed areas in Embodiment 5 of the present invention.

First, as shown in FIG. 16A, in the first transfer step, pattern transfer in the processed area 1201 is performed with an arrangement period, of the processed areas 1201, which is two times the processed area width both with respect to the first direction and the second direction, and thereafter, the removal step is performed.

Figure 16B:
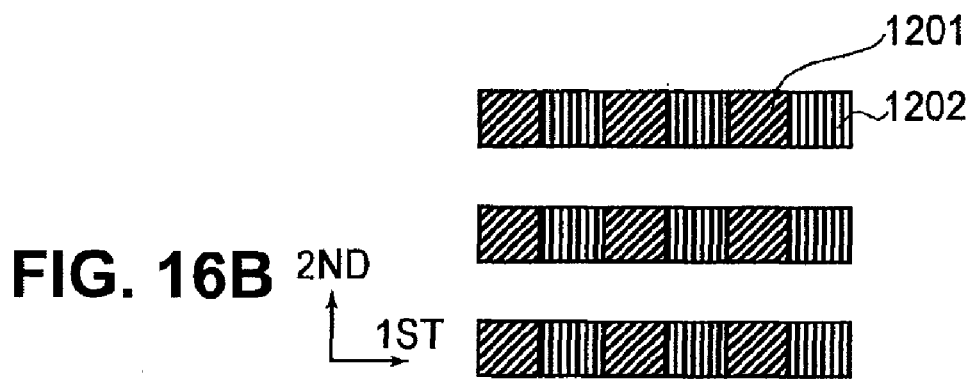
Figure 16C:
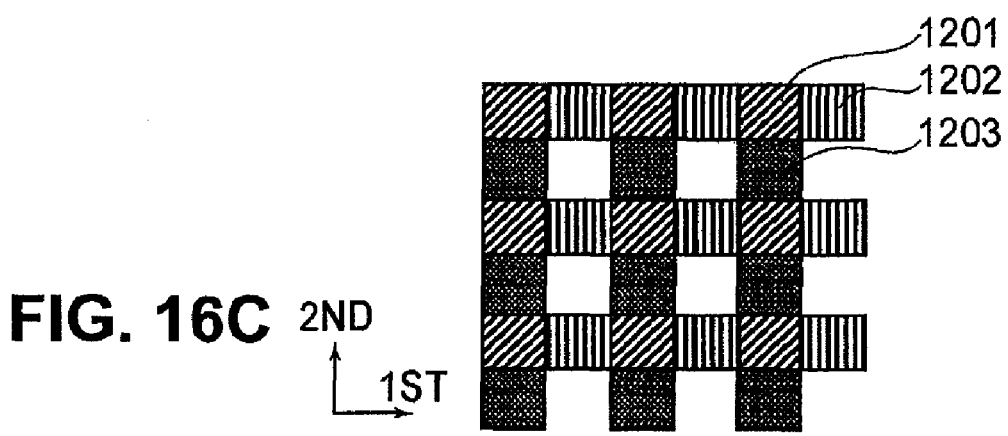

Next, as shown in FIG. 16B and FIG. 16C, in the second transfer step and the third transfer step, a pattern is transferred in the processed area 1202 between horizontal adjacent processed areas 1201 and in the processed area 1203 between vertical adjacent processed areas 1201, respectively, and thereafter, the corresponding removal step is performed.

Figure 16D:
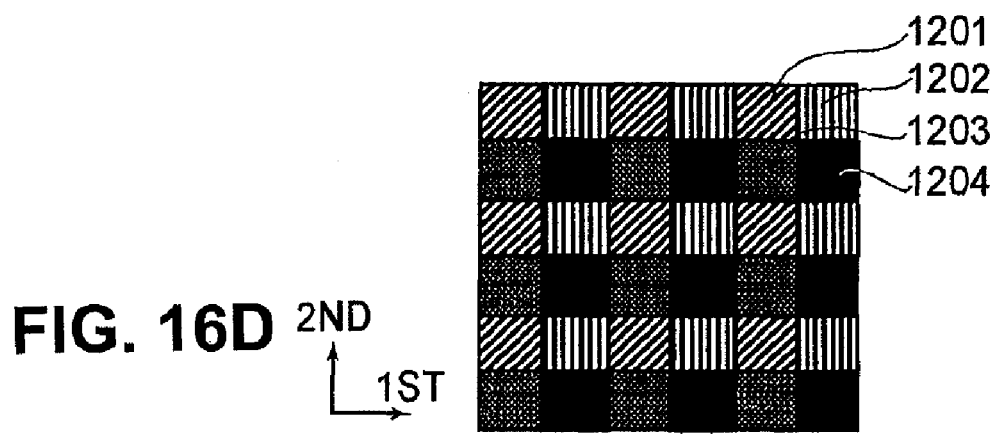

Finally, as shown in FIG. 16D, in the remaining processed area 1204, a pattern is transferred in the fourth transfer step, and thereafter, the removal step is performed.

In the method in which the pattern forming step is repeated three times, edges of the processed areas cannot be aligned with respect to either one of the first direction and the second direction. On the other hand, in the method in which the pattern forming step is repeated four times, the edges of the processed areas can be aligned with respect to both of the first direction and the second direction.

That is, the edges of the processed areas can be aligned even in the case when it is necessary to align the edges of the processed areas with respect to both of the first direction and the second direction, e.g., in the case of dicing the substrate along the edges of the processed areas in a mesh-like shape.

A method of repeating the pattern forming step two times will be described with reference to FIGS. 17A and 17B.

Figure 17A:
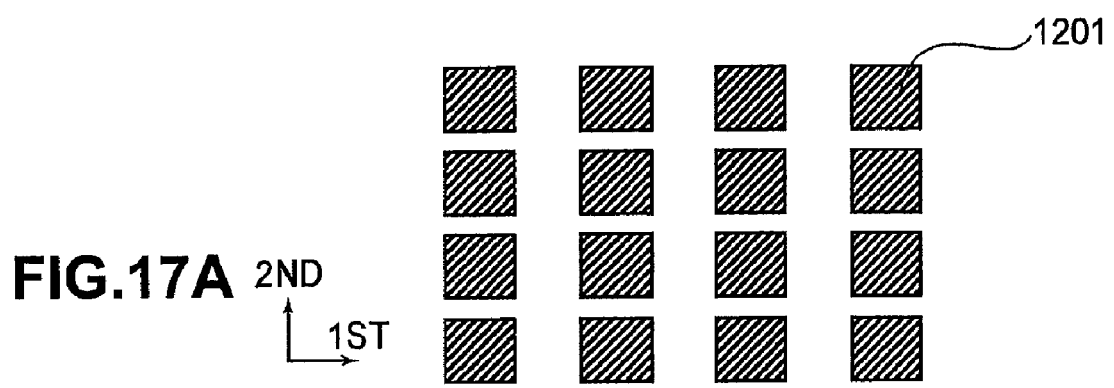

As shown in FIG. 17A, in a first transfer step, pattern transfer is performed with an arrangement period, of the processed areas 1201, which is two times the processed area width with respect to the first direction and with an appropriate interval between adjacent processed areas with respect to the second direction, and thereafter, the removal step is performed. The appropriate interval is such that the outside area in each outside area does not overlap with an adjacent processed area.

Figure 17B:
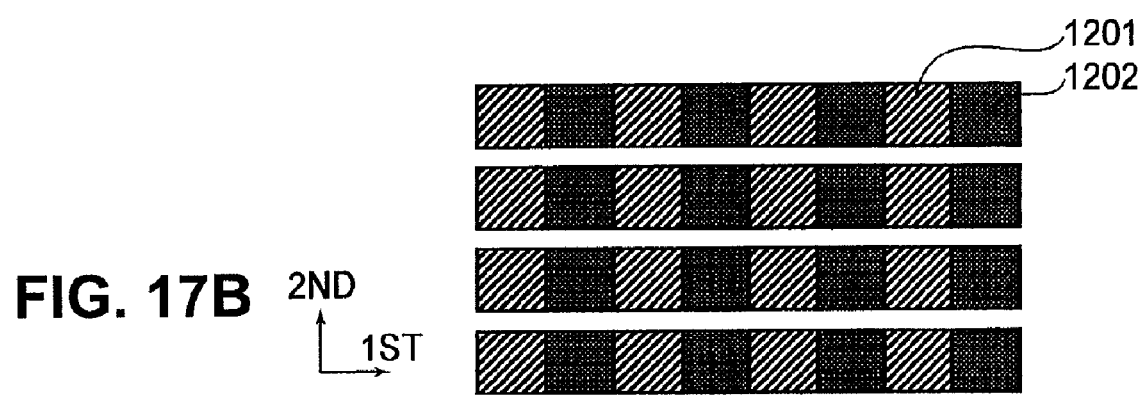

Next, as shown in FIG. 17B, in a second transfer step, a pattern is transferred in the processed areas 1202 between adjacent processed areas 1201 with respect to the first direction in the first transfer step, and thereafter, the removal step is performed.

Through the above-described steps, in the case when it is necessary to connect transfer patterns of the respective processed areas to each other only with respect to one direction, it is possible to transfer the pattern by repeating the pattern forming step only two times, less than three times.

In the present invention, the number of repetitions of the pattern forming step, the arranging method of the processed areas, the order of the arrangement, and the shape of the mold in the processed area, are not limited to those described above.

(Embodiment 6)

A difference of Embodiment 6 from Embodiment 5 is a constitution of the mold used in each of the transfer steps and, therefore, only the difference will be described.

In the present invention, the same mold is not necessarily used in the respective transfer steps. That is, e.g., in the method of repeating the pattern forming step four times in Embodiment 2, it is also possible to use different molds in the first to fourth transfer steps, respectively.

Figure 18A:
FIGS. 18A to 18D are schematic views for illustrating substrate processing in Embodiment 6 of the present invention.

FIG. 18A shows a stage after the first transfer step is completed.

Figure 18B:
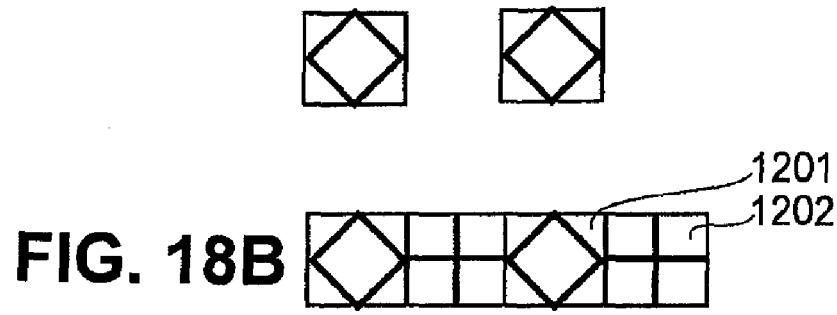

FIG. 18B shows a stage after the second transfer step is completed. The mold used in the second transfer step has a pattern different from that of the mold used in the first transfer step.

Figure 18C:
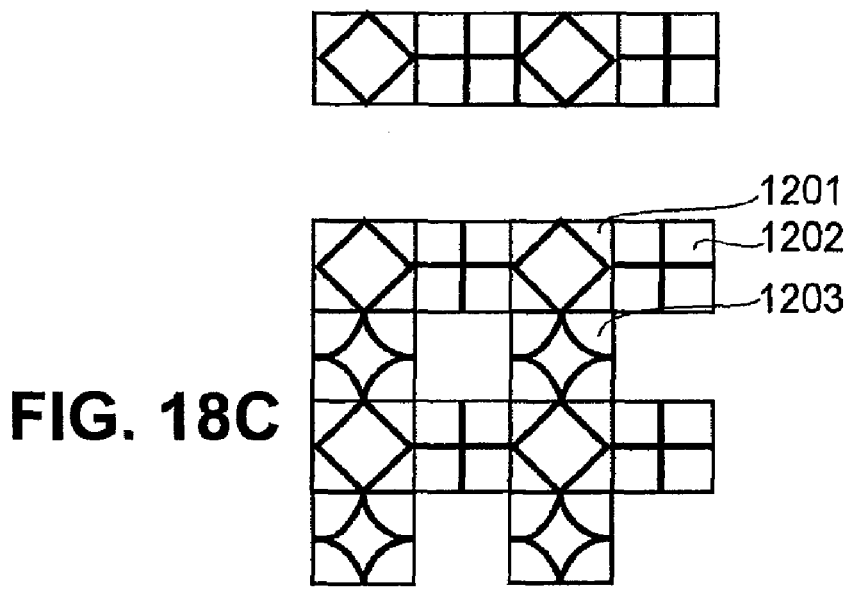

FIG. 18C shows a stage after the third transfer step is completed. The mold used in the third transfer step has a pattern different from those of the molds used in the first and second transfer steps.

Figure 18D:
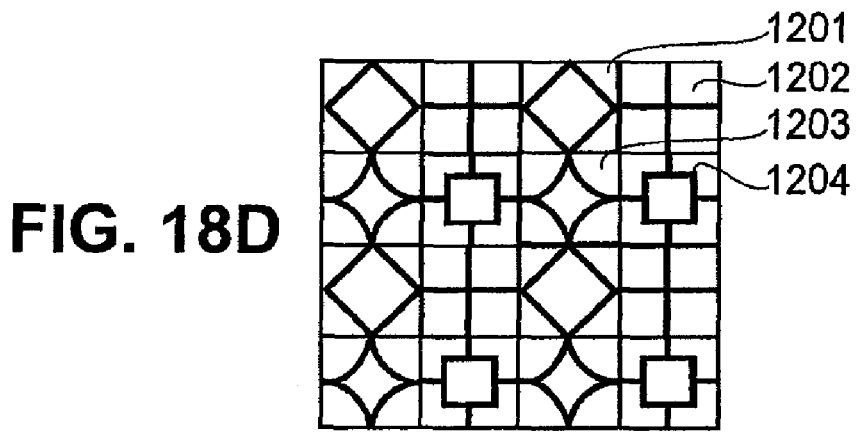

FIG. 18D shows a stage after the fourth transfer step is completed. The mold used in the fourth transfer step has a pattern different from those of the molds used in the first to third transfer steps.

When the mold having the same pattern is used in all the transfer steps, only a pattern with a period corresponding to one processed area, at the largest, can be transferred. However, as in this embodiment, molds having the different patterns are used in the transfer steps, respectively, so that it is possible to transfer a pattern having a four-time periodical structure.

As described above, in this embodiment, a mold having the different pattern is used in each of the respective transfer steps, so that it is possible to transfer a pattern with a larger period.

INDUSTRIAL APPLICABILITY

According to the present invention, it is possible to provide an imprinting method capable of easily removing the resin material layer in the outside area extruded from the processed area. It is also possible to provide a method of processing a substrate using the imprinting method of the present invention.

While the invention has been described with reference to the structures disclosed herein, it is not confined to the details set forth, and this application is intended to cover such modifications or changes as may come within the purpose of the improvements or the scope of the following claims.

The invention claimed is:

1. An imprint method in which a step of forming a pattern by imprinting a pattern of a mold onto a resin material on a substrate is repeated multiple times, said imprint method comprising:
   (A) a step of forming a pattern for a first time by carrying out an imprint method comprising:
      (a) a step of forming (i) a processed area in which an imprint pattern corresponding to the pattern of the mold is formed and (ii) an outside area at a periphery of the processed area, by bringing the mold into contact with the resin material formed on the substrate, so that a portion of the resin material is extruded from the processed area into the outside area;
      (b) a step of forming a protection layer for protecting the processed area, such that a layer of the resin material in the outside area, formed at a boundary between the processed area and the outside area, is used as a boundary wall; and
      (c) a step of removing the layer of the resin material in the outside area, while the imprint pattern formed on the layer of the resin material in the processed area is protected by the protection layer, so as not to be removed;
   (B) a step of forming a pattern for a second time through steps including a step of forming a second processed area by bringing the mold into contact with a resin material formed in an area that includes the outside area and is adjacent to the original processed area;
   (C) a step of forming a second protection layer for protecting the second processed area on a layer of the resin material in the second processed area; and
   (D) a step of removing excess resin material at a periphery of the second processed area, while the patterns formed in the original and the second processed areas are protected by the first and second protection layers, so as not to be removed,
   wherein, in the step of forming a pattern for a second time, the pattern for the second time is formed so as to be connected to the pattern for the first time.

2. An imprint method according to claim 1, wherein, in said step of forming the pattern for the first time, when a plurality of processed areas is formed in the original processed area with respect to at least one of a first direction and a second direction perpendicular to the first direction, an interval between adjacent processed areas of the plurality of the processed areas is an integral multiple of a length of a width of each processed area.

3. An imprint method according to claim 2, wherein the length of the width of each processed area includes a length corresponding to an adjusting amount including a processing error of the mold and an alignment error between the substrate and the mold.

4. An imprint method according to claim 2, wherein said step of forming the pattern is repeated three times, and said imprint method further comprises:
   (E) a step of forming each of the processed areas so that an interval between adjacent processed areas of the plurality of processed areas formed in the original processed area with respect to the first direction is two times a length of a width of the original processed area and the processed areas with respect to the second direction are disposed so as not to be adjacent to each other; and
   (F) a step of forming a third processed area in an area adjacent to the second processed area after said step of forming the pattern for the second time.

5. An imprint method according to claim 1, wherein, when the step of forming the pattern is repeated multiple times, different molds are used in said steps of forming the patterns respectively.

6. A method of processing a substrate, the processing method comprising:
   a step of performing an imprint method according to claim 1, to imprint the pattern for the first time and the pattern for the second time on a resin material on the substrate; and
   a step of processing the original processed area and the second processed area of the substrate simultaneously, by using the pattern for the first time and the pattern for the second time as a mask.

7. A method of manufacturing a semiconductor device, the method comprising:
   a step of forming a semiconductor device by using a method of processing a substrate according to claim 6.

\* \* \* \* \*